United States Patent [19]

Wong

[11] Patent Number: 4,720,431

[45] Date of Patent: Jan. 19, 1988

[54] SILICONE ENCAPSULATED DEVICES

[75] Inventor: Ching-Ping Wong, Lawrence Township, Mercer County, N.J.

[73] Assignee: American Telephone and Telegraph Company AT&T Technologies, Inc., Berkeley Heights, N.J.

[21] Appl. No.: 872,294

[22] Filed: May 21, 1986

[51] Int. Cl.[4] ................................................. B32B 9/04
[52] U.S. Cl. .................................... 428/447; 427/58; 528/15; 528/31; 528/32; 525/478; 524/786; 524/862
[58] Field of Search ............................. 528/15, 31, 32; 525/478; 524/862, 786; 427/58; 428/447

[56] References Cited

U.S. PATENT DOCUMENTS

| | | | |
|---|---|---|---|
| 3,677,981 | 7/1972 | Wada et al. | 528/15 |
| 3,697,473 | 10/1972 | Polmanteer et al. | 528/15 |
| 4,057,596 | 11/1977 | Takamizawa et al. | 528/15 |
| 4,564,562 | 1/1986 | Wong . | |
| 4,592,959 | 6/1986 | Wong . | |

*Primary Examiner*—Melvyn I. Marquis
*Attorney, Agent, or Firm*—Joel F. Spivak

[57] ABSTRACT

The addition of a low viscosity (2 to 100 centipoise) polysiloxane such as polydimethylsiloxane to a two-part heat curable polysiloxane system substantially eliminates the formation of bubbles when such system is employed as a potting compound for encapsulating devices such as electronic devices.

8 Claims, No Drawings

SILICONE ENCAPSULATED DEVICES

TECHNICAL FIELD

This invention relates to electronic devices which are encapsulated by means of a polymeric encapsulant or potting compound and more particularly, to such devices which are encapsulated by means of a two part, heat curable silicone resin.

BACKGROUND OF THE INVENTION

Two part, heat curable silicone resins have been used in various industrial applications because of their thermal stability, dielectric properties, mechanical properties, chemical resistance and resistance to atmospheric deterioration. In the electronic industry, these resins have been used as encapsulants and potting compounds for electronic devices such as integrated circuit devices and circuit board mounted power supplies. However, it has been found in certain applications, e.g., as a potting compound for circuit board mounted power supplies, bubbles often become entrapped in the silicone during curing and also rise to the surface of the silicone. Such bubbles adversely affect the reliability of the silicone as an encapsulant or potting material and also cause cosmetic defects when the bubbles break through the surface of the cured polymer. I have now discovered a modifier for such silicone resins which substantially eliminates the aforementioned problems and allows for the potting of such things as board-mounted power supplies with a two part, heat curable silicone resin with little or no formation of surface bubbles or entrapped bubbles.

SUMMARY OF THE INVENTION

An article of manufacture comprises an electronic device having a heat curable silicone resin potting compound thereover, wherein the silicone resin is formed by curing a two-part mixture (Part A and Part B) of relatively high viscosity polysiloxanes. Part A, comprises a polysiloxane which includes reactive Si—H groups, and Part B, comprises a polysiloxane which includes reactive —CH=CH$_2$ groups. Trace amounts of a platinum catalyst are added to either or both Part A and Part B. The potting material further includes in at least Part A or Part B the following: in Part A, a low viscosity polysiloxane containing —Si—H groups, or in Part B, a low viscosity polysiloxane containing —CH=CH groups.

DETAILED DESCRIPTION

The need for improved silicone resins as potting compounds for electronic devices becomes apparent when one views a potted device wherein the silicone resin has developed bubbles during curing. Many of the bubbles extend to the surface of the resin material as well as remaining embedded in the cured resin. The presence of such bubbles not only causes a cosmetic defect but also adversely affects the reliability of the potting compound as a protecting encapsulant for the underlying electronic device.

In general, the novel formulations useful as potting compounds for electonic devices in accordance with the present invention are crosslinked silicone polymers derived from heat curing a two-part polymer system wherein one part contains a high viscosity polysiloxane, e.g., a polydialkylsiloxane or a polyalkylarylsiloxane having reactive hydride (Si—H) groups and the second part contains a high viscosity polysiloxane, e.g., a polydialkylsiloxane or a polyalkylarylsiloxane having reactive vinyl groups (—CH=CH$_2$). The system further includes an organic-platinum catalyst. When the two parts are heated in the presence of the catalyst they cure to form a crosslinked high molecular weight silicone polymer. Typical viscosities of the hydride containing part are from about 750-1250 centipoise while typical viscosities of the vinyl containing part are from 2500-3500 centipoise.

In addition to the primary components indicated above, the composition may also include fillers such as silica, alumina, and/or carbon black. Silica and alumina fillers are often added in amounts of up to about 30-45 weight percent, while carbon black is generally added in much smaller amounts such as up to about one weight percent. Part A (Si—H), is generally mixed with Part B (CH=CH$_2$), in a 1:1 ratio but may also be mixed in ratios of up to about 2:1. When used as a potting compound in this form without the addition of the low viscosity (2-100 centipoise) component, bubble formation upon potting the device remains a problem.

The feature of the present invention is the addition to Part A of a low viscosity polydialkylsiloxane or polyalkylarylsiloxane having a hydride group and/or to Part B of a similar low viscosity polysiloxane having a reactive vinyl group. Typical viscosities of these additives are from 2 to 100 centipoise and they are typically added in amounts of from 5-15 weight percent of the part to which they are added.

Preferred additives are polydimethylsiloxane haing either reactive hydride groups or reactive vinyl groups, or a polymethylphenylsiloxane having reactive hydride or reactive vinyl groups. It has been found that the addition of these low viscosity materials to the commercially available potting compounds substantially eliminates bubble formation upon curing during potting of the electronic device.

Parts A and B of the two component heat curable silicone formulations suitable for use in the present invention may be represented by the following formula:

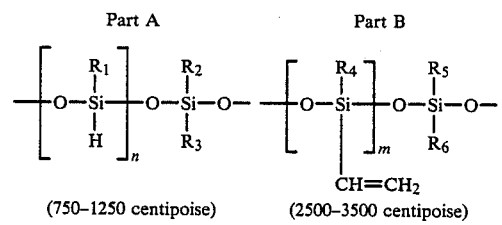

wherein n is usually greater than m. When Part A and Part B are combined in the presence of a platinum catalyst and heat, a crosslinking reaction occurs wherein the hydrogen atom attached to the silicon atom of the polymer of Part A combines with the vinyl carbon atom of the polymer of Part B so as to crosslink the two polymers and form the cured potting compound.

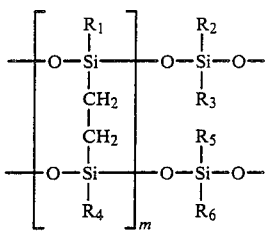

When the low viscosity additive had a hydride function it is added to Part A so as to prevent interaction of the hydride with the vinyl group before mixing Parts A and B. Similarly, if the low viscosity additive is one having functional vinyl groups, it is added to Part B so as to prevent interaction with the hydride of Part A until mixing of the two parts. Typically, $R_1$ to $R_6$ are low molecular weight alkyl groups, e.g., methyl and ethyl groups or may be an aryl group, e.g., a phenyl group. The preferred compositions employ low viscosity additives which have viscosities of from 20–30 centipoise which constitute from 5–10 weight percent of the part to which it is added.

A typical commercially available two part, heat curable potting material which can be modified by the low viscosity additives as set forth herein is Dow Corning Sylgard 170. This is a two-part formulation wherein Part A contains a polydimethylsiloxane having reactive hydride groups and having a viscosity of from about 1000±250 centipoise, and Part B contains a polydimethylsiloxane and having reactive vinyl groups and haing a viscosity of from about 3000±500 centipoise. Also included in either or both Part A and Part B are small amounts, e.g., several ppm, of an organic platinum cataylyst. Upon mixing Part A with Part B the reactive hydride groups of Part A react with the vinyl groups of Part B so as to form a crosslinked high molecular weight polymer.

Suitable additives to this material are a hydride containing polydimethylsiloxane having a viscosity of from 2–100 centipoise in an amount of from 5–15 weight percent of Part A and/or a vinyl containing polydimethylsiloxane of similar viscosity and in a similar weight percent added to Part B. Alternatively, one can employ Dow-Corning's DC-4939 gel two-part system comprising hydride and vinyl containing polymethylphenylsiloxanes as the major component thereof, together with low viscosity polymethylphenylsiloxane additives similar in viscosity and amount as set forth above.

EXAMPLE

An electronic device such as a board-mounted power supply is potted with a heat curable silicone resin formulation in accordance with the following procedure. To Part A of Dow Corning Sylgard 170 heat curable silicone resin (a polydimethylsiloxane having reactive hydride groups and having a viscosity of 1000±250 centipoise) is added a polydimethylsiloxane having reactive hydrides and a viscosity of 30 centipoise in an amount equal to 10 percent by weight of Part A. This mixture is then combined with an equal amount of Part B of the Sylgard material which is a polydimethylsiloxane having vinyl reactive groups and a viscosity of 3000±500 centipoise. Parts A and/or B contain several ppm of an organic type platinum catalyst which helps initiate the crosslinking reaction upon mixing Part A with B in the presence of heat. The mixture is then heated to about 150° C. and then cast over the device to be potted which has been placed in a mold to accept the potting compound. The potting material flows onto and around the device and is held at 150° C. on a partial vacuum of about 20″ mercury for 60 minutes, which time is generally sufficient to obtain substantially complete curing of the silicone resin.

What is claimed is:

1. An article of manufacture comprising an electronic device having an essentially bubble-free, cured, cast silicone resin potting compound encapsulating said device, wherein said potting compound is formed by heat-curing a two-part mixture comprising relatively high viscosity polysiloxane, at least one part of which contains a platinum catalyst in an amount sufficient to catalyze a cross-linking reaction upon mixing said two parts with the application of heat, and at least one part of which further contains 5 to 15 weight percent of a low viscosity polysiloxane having a similar reactive group as the high viscosity polysiloxane in said part, said low viscosity polysiloxane having a viscosity at 25° C. of from 2 to 100 centipoise, and wherein the high viscosity polysiloxane of one part consists essentially of a polysiloxane of one part consists essentially of a polysiloxane having reactive

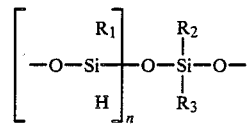

groups wherein n is an integer such that the viscosity at 25° C. is from 750 to 1250 centipoise and wherein the high viscosity polysiloxane of the other part consists essentially of a polysiloxane having reactive

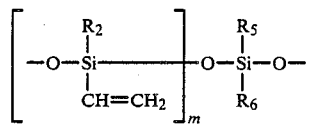

groups where m is an integer such that the viscosity at 25° C. is from 2500 to 3500 centipoise and wherein $R_1$–$R_6$ are selected from the group consisting of low molecular weight alkyl groups and aryl groups.

2. The article of manufacture recited in claim 1 wherein said polysiloxanes are selected from the group consisting of polydialkylsiloxanes and polyalkylarlysiloxanes.

3. The article of manufacture recited in claim 1 wherein said polysiloxanes are selected from polydimethylsiloxane and polymethylphenylsiloxanes.

4. The article of manufacture recited in claim 3 wherein the low viscosity polysiloxane has a viscosity of from 20 to 30 centipoise and is present in an amount equal to 5 to 10 weight percent of the part to which it is added.

5. The article of manufacture recited in claim 4 further comprising in the silicone resin potting compound at least one member of the group selected from silica, alumina and carbon black.

6. The article of manufacture recited in claim 1 wherein the first part and second part are mixed in a weight ratio of from between 1:1 to 2:1.

7. The article of manufacture recited in claim 6 wherein the low viscosity polysiloxane is a polydimethylsiloxane which is added to either the two parts and has a viscosity of from 20 to 30 centipoise and is present in an amount equal to from 5 to 10 weight percent of the part to which it is added.

8. The article of manufacture recited in claim 6 wherein the silicone resin potting compound further comprises up to 45 weight percent of a filler selected from silica and alumina and up to one weight percent of carbon black.

* * * * *